(12) United States Patent
Chang

(10) Patent No.: US 11,411,029 B2
(45) Date of Patent: Aug. 9, 2022

(54) IMAGE SENSING CHIP PACKAGE STRUCTURE INCLUDING ADHESIVE LOOP

(71) Applicant: Tong Hsing Electronic Industries, Ltd., Taipei (TW)

(72) Inventor: Chia-Shuai Chang, Taipei (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 86 days.

(21) Appl. No.: 16/893,176

(22) Filed: Jun. 4, 2020

(65) Prior Publication Data
US 2020/0411574 A1 Dec. 31, 2020

Related U.S. Application Data

(60) Provisional application No. 62/866,780, filed on Jun. 26, 2019.

(51) Int. Cl.
*H01L 27/146* (2006.01)

(52) U.S. Cl.
CPC .. *H01L 27/14618* (2013.01); *H01L 27/14632* (2013.01); *H01L 27/14687* (2013.01); *H01L 27/14698* (2013.01)

(58) Field of Classification Search
CPC combination set(s) only.
See application file for complete search history.

(56) References Cited

U.S. PATENT DOCUMENTS

| | | | | |
|---|---|---|---|---|
| 2015/0364516 A1* | 12/2015 | Chen | ................ | H01L 21/02225 257/443 |
| 2017/0133520 A1* | 5/2017 | Saxod | ................ | H01L 24/30 |
| 2018/0337211 A1* | 11/2018 | Su | ................ | H01L 27/1463 |

* cited by examiner

*Primary Examiner* — Suberr L Chi
(74) *Attorney, Agent, or Firm* — Hamre, Schumann, Mueller & Larson, P.C.

(57) ABSTRACT

An image sensing chip package structure includes a chip, an adhesive loop and a light-transmissible substrate member. The chip includes an image sensing region. The adhesive loop is connected to the chip, and has an inner peripheral surface that defines a plurality of protrusions which surround the image sensing region of the chip. The light-transmissible substrate member is connected to the adhesive loop oppositely of the chip to cover the image sensing region of the chip. Methods of manufacturing the image sensing chip package structures are also provided.

8 Claims, 7 Drawing Sheets

```
┌─────────────────────────────────────────────┐
│ Forming a plurality of adhesive loops on a  │
│ light-transmissible substrate, each of the  │── S1
│ adhesive loops having an inner peripheral   │
│ surface that defines a plurality of         │
│ protrusions                                 │
└─────────────────────────────────────────────┘
                      ↓
┌─────────────────────────────────────────────┐
│ Dicing the light-transmissible substrate    │
│ into a plurality of light-transmissible     │── S2
│ substrate members, each of which has one    │
│ of the adhesive loops                       │
└─────────────────────────────────────────────┘
                      ↓
┌─────────────────────────────────────────────┐
│ Connecting a plurality of chips to the      │
│ adhesive loops, respectively, to obtain a   │
│ plurality of image sensing structures, each │
│ of the image sensing structures including   │── S3
│ one of image sensing regions of the chips   │
│ surrounded by the protrusions of one of the │
│ adhesive loops formed on one of the         │
│ light-transmissible substrate members       │
└─────────────────────────────────────────────┘
```

```
┌─────────────────────────────────────────────┐
│ Forming a plurality of adhesive loops on a  │
│ light-transmissible substrate, each of the  │
│ adhesive loops having an inner peripheral   │──── S1'
│ surface that defines a plurality of         │
│ protrusions                                 │
└─────────────────────────────────────────────┘
                      │
                      ▼
┌─────────────────────────────────────────────┐
│ Connecting a wafer to the light-            │
│ transmissible substrate through the         │
│ adhesive loops, the wafer having a          │
│ plurality of image sensing regions, each of │──── S2'
│ which is surrounded by the protrusions of a │
│ respective one of the adhesive loops        │
└─────────────────────────────────────────────┘
                      │
                      ▼
┌─────────────────────────────────────────────┐
│ Dicing the light-transmissible substrate    │
│ and the wafer to obtain a plurality of      │
│ image sensing structures, the light-        │
│ transmissible substrate being divided into  │
│ multiple light-transmissible substrate      │
│ members, each of the image sensing chip     │──── S3'
│ package structures including one of the     │
│ light-transmissible substrate members       │
│ formed with one of the adhesive loops that  │
│ surround one of the image sensing regions   │
└─────────────────────────────────────────────┘
```

IMAGE SENSING CHIP PACKAGE STRUCTURE INCLUDING ADHESIVE LOOP

CROSS-REFERENCE TO RELATED APPLICATION

This application claims priority of U.S. Provisional Patent Application No. 62/866,780, filed on Jun. 26, 2019.

FIELD

The disclosure relates to a chip package structure, and more particularly to an image sensing chip package structure and a method of manufacturing the same.

BACKGROUND

A conventional image sensing chip package structure includes a chip having an image sensing region, an adhesive member that is connected to the chip and that surrounds the image sensing region, and a light-transmissible substrate member that is connected to the adhesive member oppositely of the chip to cover the image sensing region of the chip. When light rays are transmitted to the image sensing region through the light-transmissible substrate member, an image can be detected in the image sensing region. However, some of the refracted light rays can undergo reflection when entering the light-transmissible substrate member since the refractive index changes from air to the light-transmissible substrate member. When reflected light rays hit the image sensing region, sensitivity of the image sensing region can be adversely affected due to the occurrence of flare.

SUMMARY

Therefore, an object of the present disclosure is to provide an image sensing chip package structure and a method of manufacturing the same that can alleviate at least one of the drawbacks of the prior art.

According to a first aspect of this disclosure, an image sensing chip package structure includes a chip, an adhesive loop, and a light-transmissible substrate member.

The chip includes an image sensing region. The adhesive loop is connected to the chip and has an inner peripheral surface that defines a plurality of protrusions which surround the image sensing region of the chip. The light-transmissible substrate member is connected to the adhesive loop oppositely of the chip to cover the image sensing region of the chip.

According to a second aspect of this disclosure, a method of manufacturing image sensing chip package structures is provided.

The method includes:
forming a plurality of adhesive loops on a light-transmissible substrate, each of the adhesive loops having an inner peripheral surface that defines a plurality of protrusions;
dicing the light-transmissible substrate into a plurality of light-transmissible substrate members, each of which has one of the adhesive loops; and
connecting a plurality of chips to the adhesive loops, respectively, to obtain the image sensing chip package structures, wherein each of the chips has an image sensing region, and each of the image sensing chip package structures includes one of the image sensing regions surrounded by the protrusions of one of the adhesive loops formed on one of the light-transmissible substrate members.

According to a third aspect of this disclosure, another method of manufacturing image sensing chip package structures is provided.

The method includes:
forming a plurality of adhesive loops on a light-transmissible substrate, each of the adhesive loops having an inner peripheral surface defining a plurality of protrusions;
connecting a wafer to the light-transmissible substrate through the adhesive loops, the wafer having a plurality of image sensing regions, each of which is surrounded by the protrusions of a respective one of the adhesive loops; and
dicing the light-transmissible substrate and the wafer to obtain the image sensing chip package structures, wherein the light-transmissible substrate (1') is divided into multiple light-transmissible substrate members (1), and each of the image sensing chip package structures includes one of the light-transmissible substrate members (1) formed with one of the adhesive loops that surrounds one of the image sensing regions.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 1:
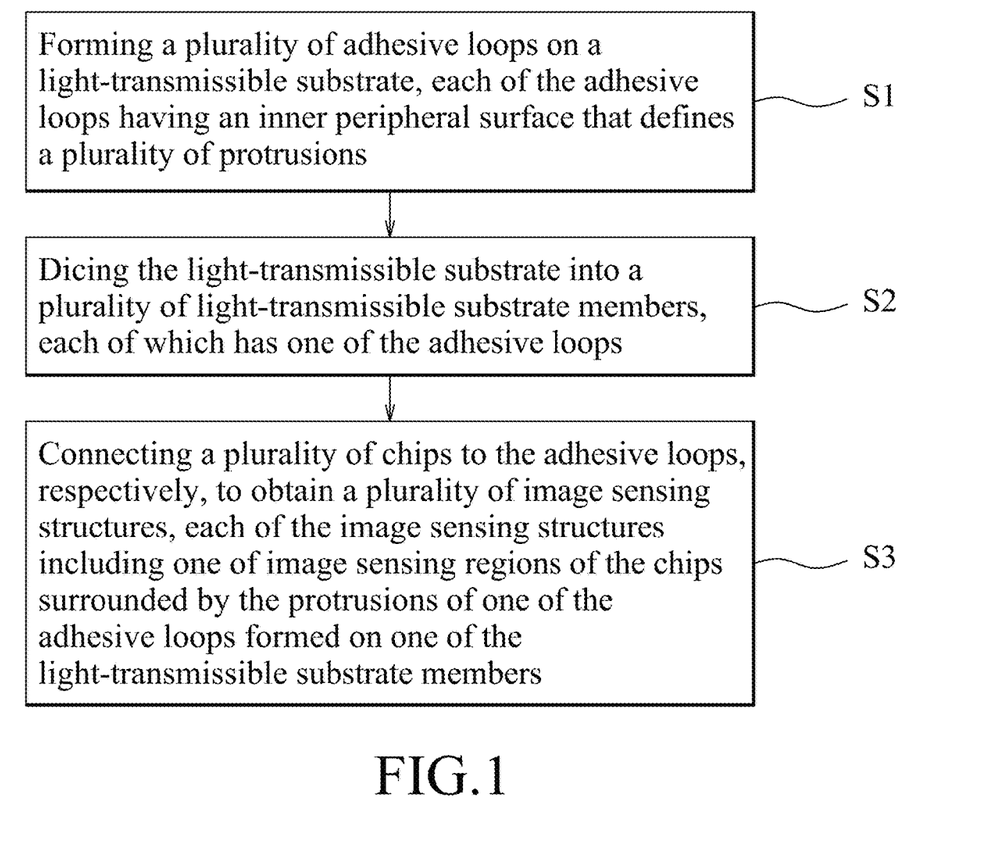
FIG. 1 is a flow chart illustrating a first embodiment of a method according to the present disclosure, the method being used for manufacturing multiple image sensing chip package structures.
Figure 5:
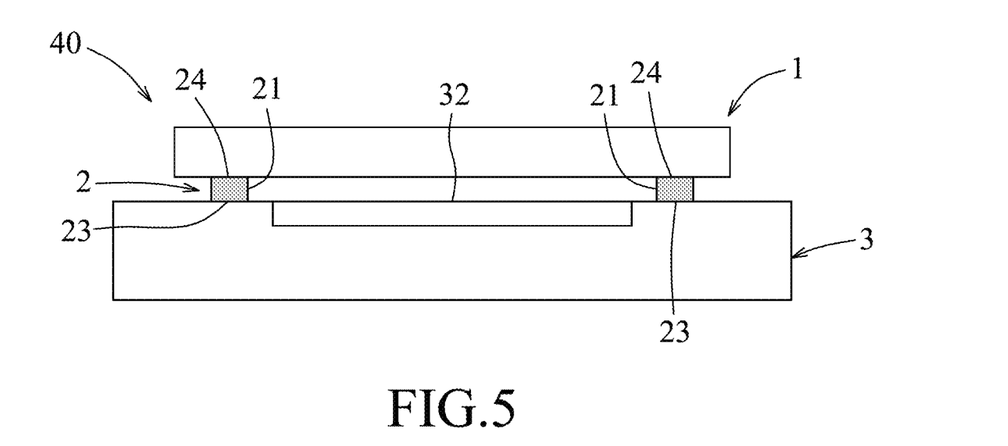

Referring to FIG. 1, a first embodiment of a method of manufacturing a plurality of image sensing chip package structures 40 (only one is shown in FIG. 5) according to the present disclosure includes steps S1 to S3.

Figure 2:
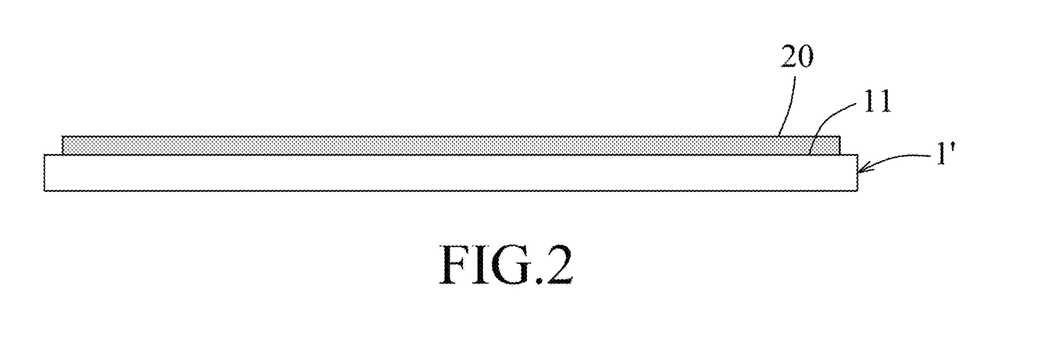
FIGS. 2 to 5 are schematic views showing consecutive steps of the first embodiment of the method.
Figure 3:
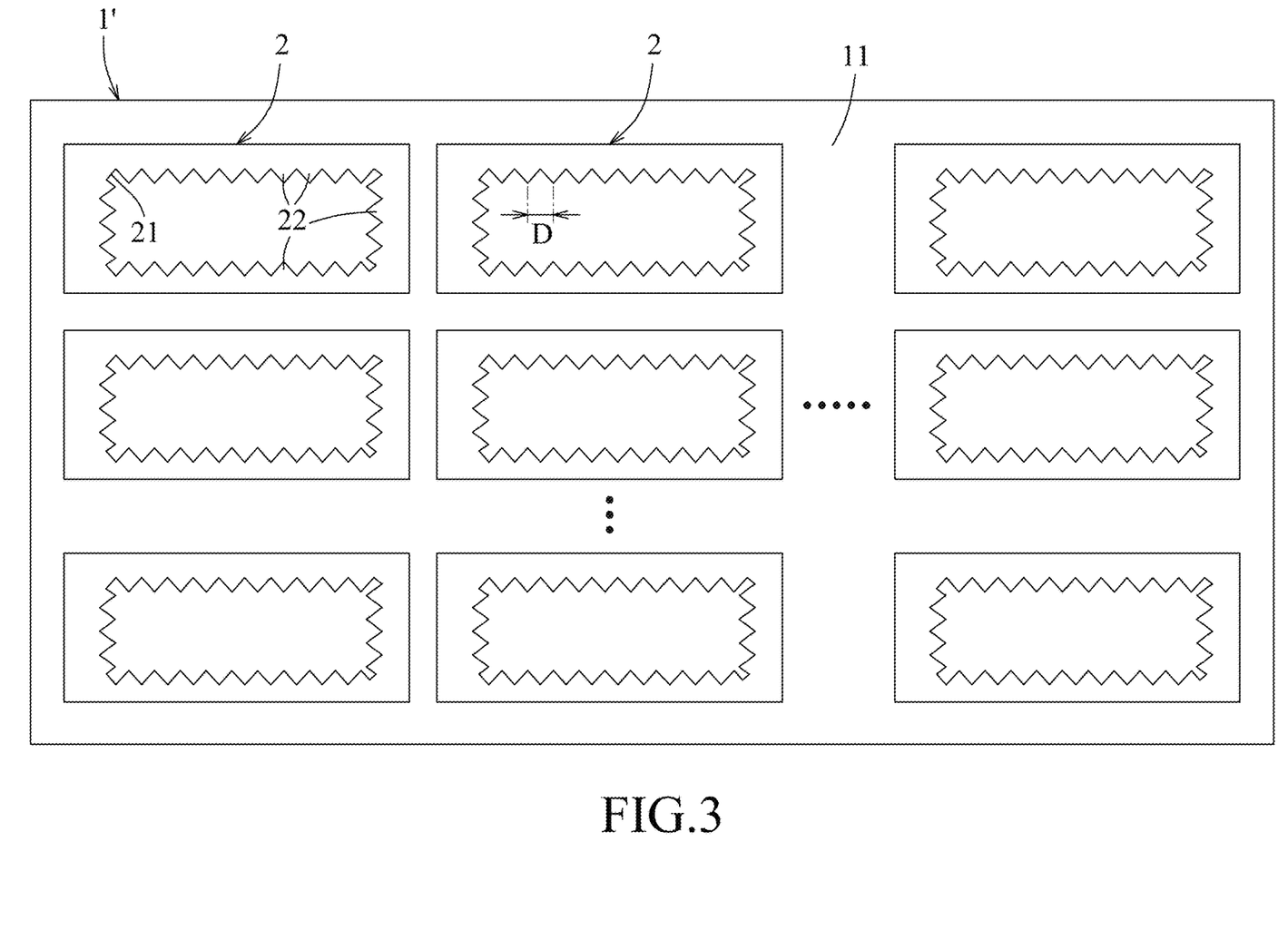

Referring to FIGS. 2 and 3 in combination with FIG. 1, in step S1, a plurality of adhesive loops 2 are formed on an upper surface 11 of a light-transmissible substrate 1'. Specifically, a layer of adhesive material 20 (see FIG. 2) is formed on the upper surface 11 of a light-transmissible substrate 1' through coating, printing, laminating, etc., followed by patterning the layer of the adhesive material 20 through photolithography and etching to form the adhesive loops 2 (see FIG. 3). While photolithography and etching are used in this embodiment, any other suitable patterning process may be used for forming the adhesive loops 2 according to other embodiments. The light-transmissible substrate 1' may be made of, but not limited to, glass, an acrylic resin, etc. The adhesive loops 2 are opaque, and may be made of, but not limited to, a silicone, an epoxy resin, etc. The adhesive loops 2 are disposed in a spaced apart manner in this embodiment.

Each of the adhesive loops 2 has an inner peripheral surface 21 that defines a plurality of protrusions 22. The protrusions 22 include repeating patterned protrusions, which repeat on the inner peripheral surface 21 and which may be identical or different in shape. The patterned protrusions are disposed at intervals, thereby forming a series of protruding and recessing profiles alternating with each other. Each protrusion 22 may have, but not limited to, a triangular shape, a rounded shape such as the shape of a circle or ellipse, or a polygonal shape. The protrusions 22 exemplified in this embodiment have triangular shapes to form a saw-toothed pattern. A center-to-center distance (D) between adjacent two of the protrusions 22 may range from 1 μm to 1 mm.

Figure 4:
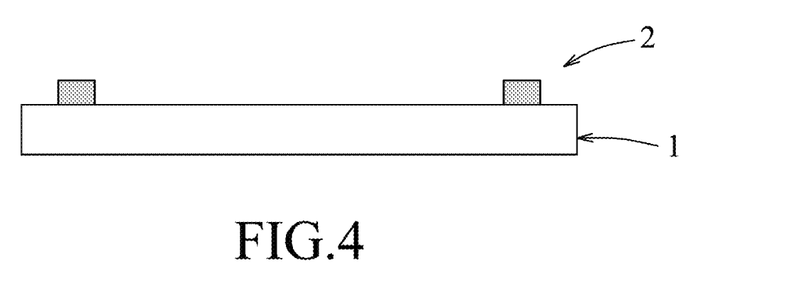

Referring to FIG. 4 in combination with FIG. 1, in step S2, the light-transmissible substrate 1' is diced into a plurality of light-transmissible substrate members 1 (only one is shown in FIG. 4), each of which has one of the adhesive loops 2.

Referring to FIG. 5 in combination with FIG. 1, in step S3, a plurality of chips 3 (only one is shown in FIG. 5) are respectively connected to the adhesive loops 2 (only one is shown in FIG. 5) to obtain the image sensing chip package structures 40. Each of the chips 3 has an image sensing region 32. Each of the image sensing chip package structures 40 includes one of the image sensing regions 32 surrounded by the protrusions 22 of one of the adhesive loops 2 formed on one of the light-transmissible substrate members 1. It should be noted that wire bonding for the chip 3 may be carried out before the chips 3 are connected to the adhesive loops 2.

As shown in FIG. 5, the image sensing chip package structure 40 manufactured by the first embodiment of the method includes the chip 3, the adhesive loop 2 and the light-transmissible substrate member 1. The chip 3 is an image sensing chip which includes the image sensing region 32. The light-transmissible substrate member 1 is connected to the adhesive loop 2 oppositely of the chip 3 to cover the image sensing region 32 of the chip 3. Due to the provision of the protrusions 22, the inner peripheral surface 21 of the adhesive loop 2 is a non-smooth surface. Light entering the image sensing chip package structure 40 through the light-transmissible substrate member 1 can be scattered by the protrusions 22 to reduce the occurrence of flare in the image sensing region 32.

Figure 6:
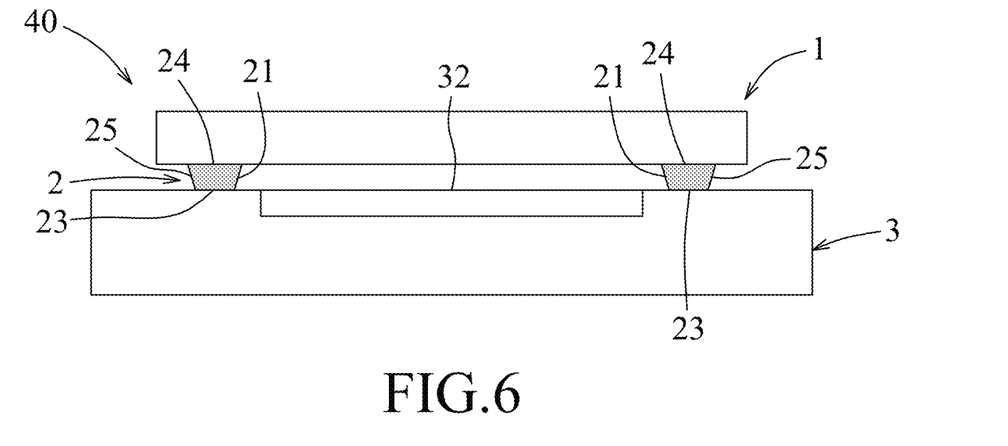
FIG. 6 is a schematic side view of a first variation of the image sensing chip package structure produced by the first embodiment.

The inner peripheral surface 21 of the adhesive loop 2 is perpendicular to the chip 3 and the light-transmissible substrate member 1 as shown in FIG. 5. FIG. 6 shows a first variation of the image sensing chip package structure 40, in which the adhesive loop 2 further has a first surface 23 that is connected to the chip 3, a second surface 24 that is connected to the light-transmissible substrate member 1, and an outer peripheral surface 25 opposite to the inner peripheral surface 21. The inner and outer peripheral surfaces 21, 25 are connected between the first and second surfaces 23, 24. The adhesive loop 2 has a thickness between the inner and outer peripheral surfaces 21, 25, and the thickness decreases from the second surface 24 to the first surface 23. Specifically, in this variation, the thickness of the adhesive loop 2 tapers from the second surface 24 to the first surface 23.

Figure 7:
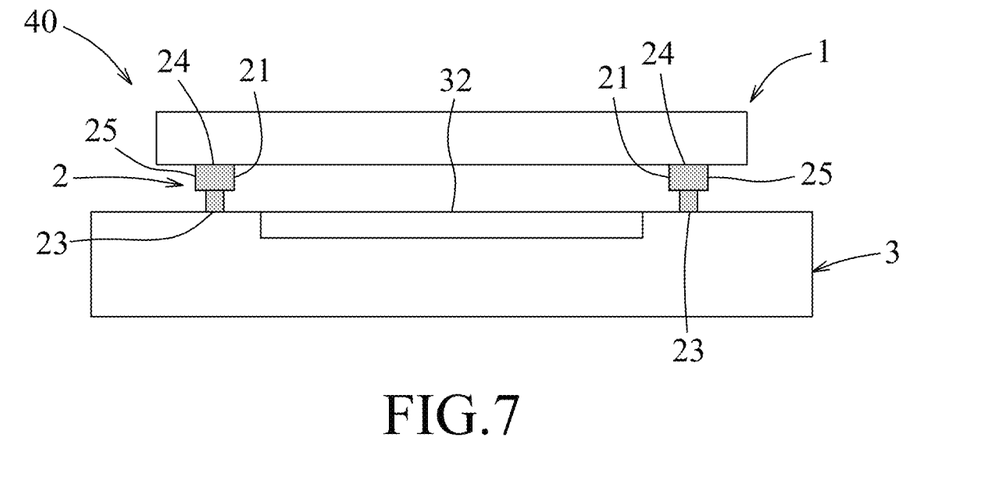
FIG. 7 is a schematic side view of a second variation of the image sensing chip package structure produced by the first embodiment.

Referring to FIG. 7, in a second variation of the image sensing chip package structure 40, the thickness of the adhesive loop 2 decreases from the second surface 24 to the first surface 23 in a stepped manner. It should be noted that, by making the width of the first surface 23 to be smaller than the second surface 24, an outer periphery of the image sensing region 32 can be made closer to an outer peripheral of the chip 3, which leads to a size reduction of the image sensing chip package substrate 40.

Figure 8:
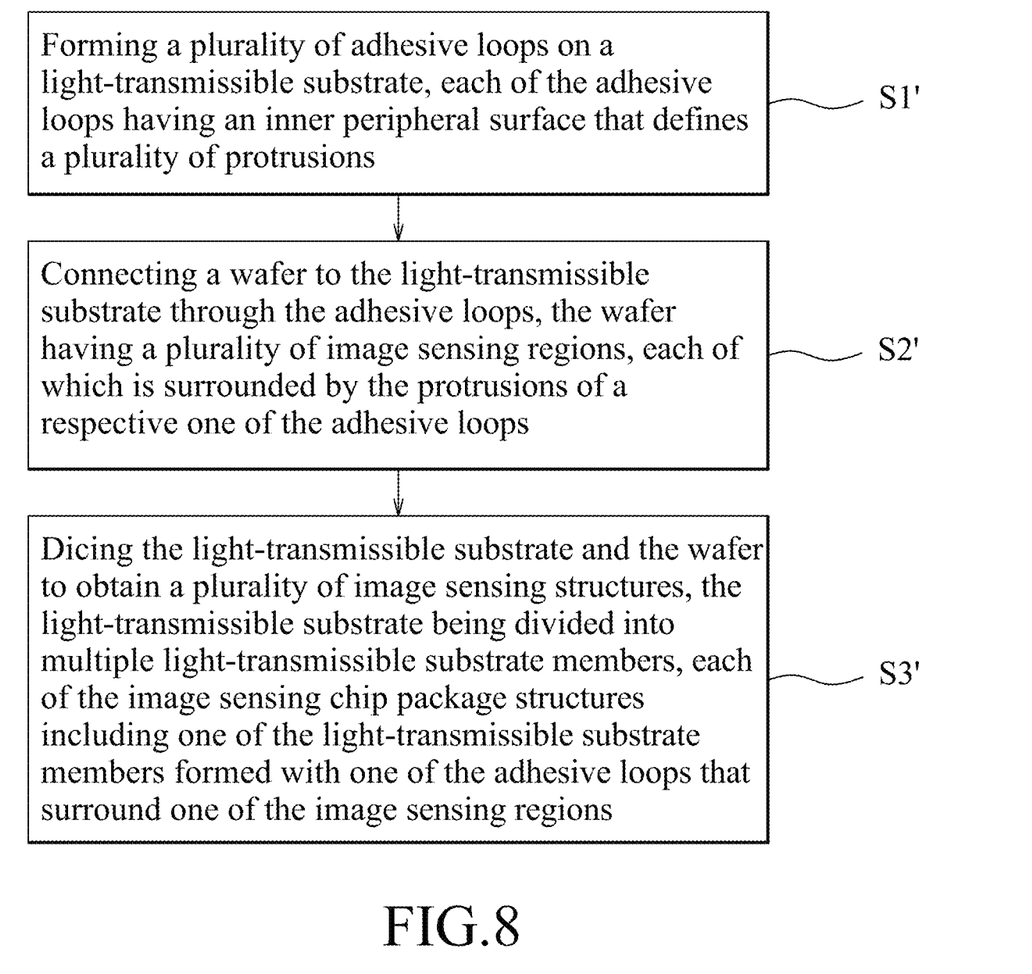
FIG. 8 is a flow chart of a second embodiment of the method of manufacturing the image sensing chip package structures.
Figure 12:
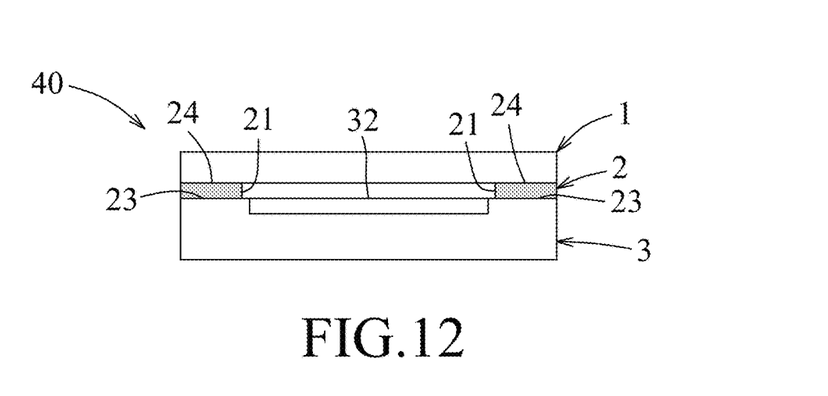

Referring to FIG. 8, a second embodiment of the method of manufacturing a plurality of the image sensing chip package structures 40 (only one is shown in FIG. 12) according to the present disclosure is modified from the first embodiment of the method. The second embodiment of the method includes steps S1' to S3'.

Figure 9:
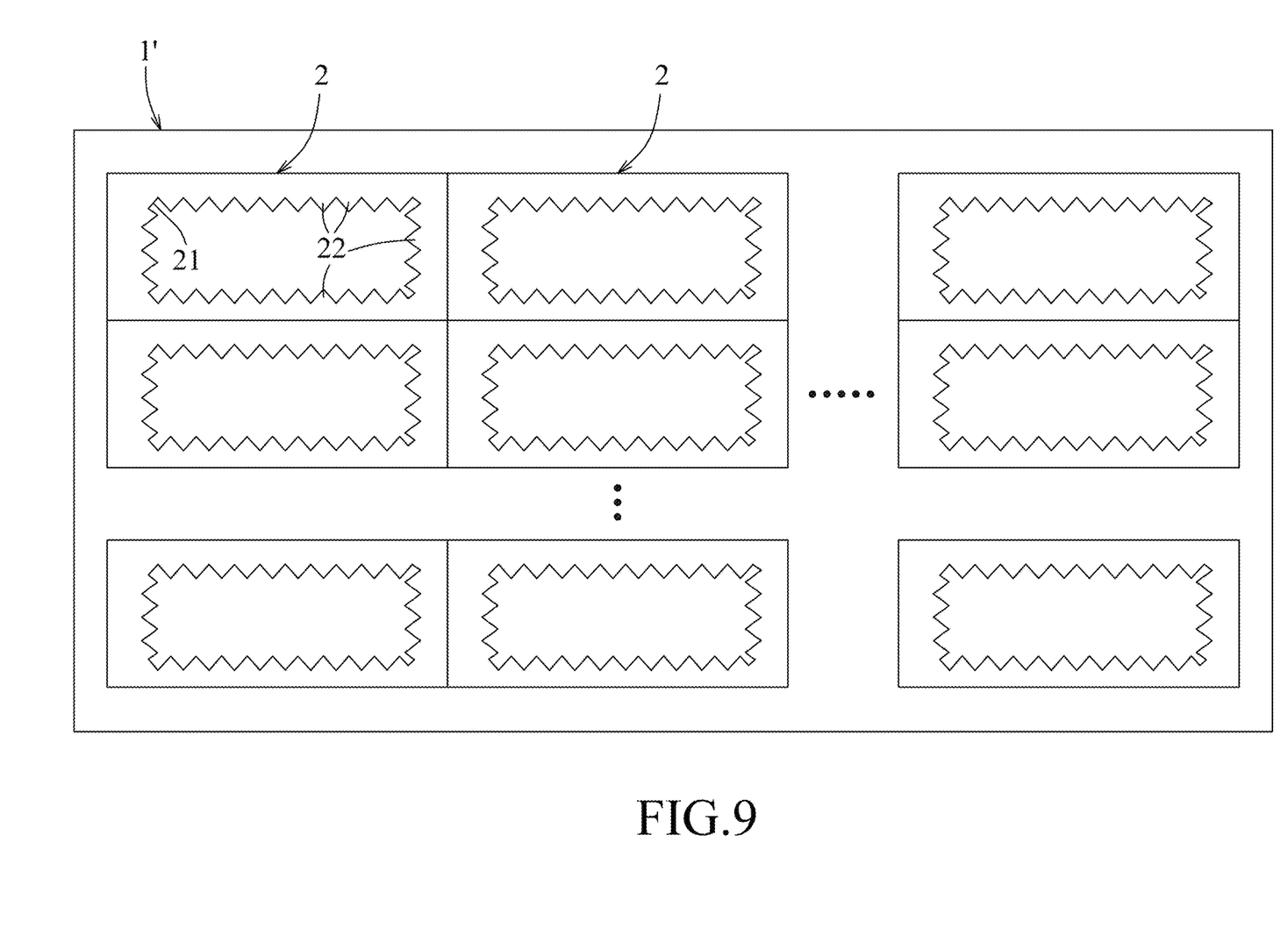
FIGS. 9 to 12 are schematic views showing consecutive steps of the second embodiment of the method.

Referring to FIGS. 8 and 9, in step S1', a plurality of the adhesive loops 2 are formed on the light-transmissible substrate 1'. Each of the adhesive loops 2 has the inner peripheral surface 21 defining a plurality of the protrusions 22. The adhesive loops 2 in this embodiment are close to or adjoin each other.

Figure 10:
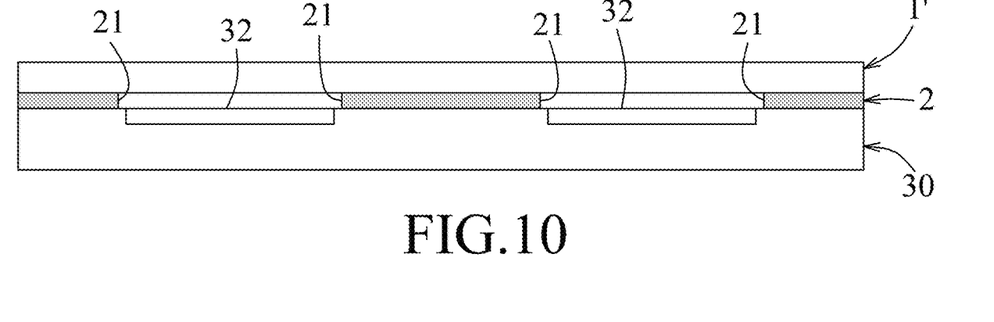

Referring to FIGS. 8 and 10, in step S2', a wafer 30 is connected to the light-transmissible substrate 1' through the adhesive loops 2. The wafer 30 may be an image sensing wafer, and has a plurality of the image sensing regions 32, each of which is surrounded by the protrusions 22 of a respective one of the adhesive loops 2.

Figure 11:
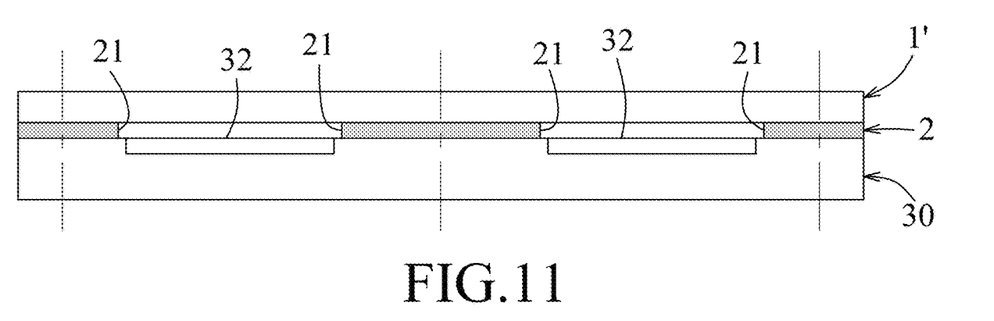

Referring to FIGS. 8, 11 and 12, in step S3', the light-transmissible substrate 1' and the wafer 30 are diced to obtain the image sensing chip package structures 40. By dicing, the light-transmissible substrate is divided into multiple light-transmissible substrate members 1. Each of the image sensing chip package structures 40 includes one of the light-transmissible substrate members 1 formed with one of the adhesive loops 2 that surrounds one of the image sensing regions 32.

To sum up, because light entering the image sensing chip package structure 40 according to the present disclosure can be scattered by the protrusions 22, the occurrence of flare at the image sensing region 32 can be reduced.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiment but is intended to cover various arrangements included within the spirit and scope of the broadest interpretation so as to encompass all such modifications and equivalent arrangements.

What is claimed is:

1. An image sensing chip package structure comprising:
a chip including an image sensing region;
an adhesive loop connected to said chip and having an inner peripheral surface that defines a plurality of protrusions which surround said image sensing region of said chip; and
a light-transmissible substrate member that is connected to said adhesive loop oppositely of said chip to cover said image sensing region of said chip.

2. The image sensing chip package structure as claimed in claim 1, wherein a center-to-center distance between adjacent two of said protrusions ranges from 1 µm to 1 mm.

3. The image sensing chip package structure as claimed in claim 1, wherein said inner peripheral surface of said adhesive loop is not perpendicular to said chip and said light-transmissible substrate member.

4. The image sensing chip package structure as claimed in claim 3, wherein:
said adhesive loop further has a first surface that is connected to said chip, a second surface that is connected to said light-transmissible substrate member, and an outer peripheral surface opposite to said inner peripheral surface, said inner and outer peripheral surfaces being connected between said first and second surfaces;
said adhesive loop has a thickness between said inner and outer peripheral surfaces, the thickness decreasing from said second surface to said first surface.

5. The image sensing chip package structure as claimed in claim 4, wherein the thickness of said adhesive loop tapers from said second surface to said first surface.

6. The image sensing chip package structure as claimed in claim 4, wherein the thickness of said adhesive loop decreases from said second surface to said first surface in a stepped manner.

7. The image sensing chip package structure as claimed in claim 1, wherein said protrusions form a saw-toothed pattern.

8. The image sensing chip package structure as claimed in claim 1, wherein said protrusions form a series of protruding and recessing profiles alternating with each other.

* * * * *